(12) United States Patent
Chang et al.

(10) Patent No.: US 8,402,405 B1
(45) Date of Patent: Mar. 19, 2013

(54) SYSTEM AND METHOD FOR CORRECTING GATE-LEVEL SIMULATION ACCURACY WHEN UNKNOWNS EXIST

(75) Inventors: Kai-Hui Chang, North Andover, MA (US); Yen-Ting Liu, Kaohsiung (TW); Christopher S. Browy, Boston, MA (US); Chilai Huang, Andover, MA (US)

(73) Assignee: Avery Design Systems, Inc., Andover, MA (US)

( * ) Notice: Subject to any disclaimer, the term of this patent is extended or adjusted under 35 U.S.C. 154(b) by 0 days.

(21) Appl. No.: 13/477,743

(22) Filed: May 22, 2012

Related U.S. Application Data (60) Provisional application No. 61/535,579, filed on Sep. 16, 2011, provisional application No. 61/593,892, filed on Feb. 2, 2012.

(51) Int. Cl.
*G06F 9/455* (2006.01)
*G06F 17/50* (2006.01)
(52) U.S. Cl. ........ 716/106; 716/107; 716/108; 716/111; 716/112; 716/136
(58) Field of Classification Search .......... 716/106–115, 716/136
See application file for complete search history.

(56) References Cited

U.S. PATENT DOCUMENTS

| 7,761,277 B2 * | 7/2010 | Nicholas | 703/14 |
| 2010/0017187 A1 | 1/2010 | Hira et al. | |
| 2012/0072876 A1 * | 3/2012 | Salz et al. | 716/102 |

OTHER PUBLICATIONS

"Handling Nondeterministic in logic Simulation So That Your Waveform Can Be Trusted Again", by Kai-Hui Chang, Hong-Zu Chou, Haiqian Yu, Dylan Dobbyn, and Sy-Yen Kuo, IEEE @2011.*

* cited by examiner

*Primary Examiner* — Nha Nguyen
(74) *Attorney, Agent, or Firm* — William A. Loginov; Keri E. Sicard; Loginov & Associates, PLLC (57) ABSTRACT

This invention provides a system and method for correcting gate-level simulation commences by identifying unknown values (Xs) that are falsely generated during the simulation of a given trace for a design netlist. Then, a sub-circuit of the design netlist is determined for each false X that has inputs of real Xs and an output of a false X. Finally, simulation correction code is generated based on the sub-circuit to eliminate false Xs in simulation of the design netlist. The original design netlist can then be resimulated with the simulation repair code to eliminate false Xs. This allows gate-level simulation to produce correct results.

11 Claims, 9 Drawing Sheets

TRACE FAN-IN CONE OF INPUT
TO GENERATE A SUBCIRCUIT (SUBCKT)
410

BUILD BOOLEAN FUNCTION FROM SUBCKT
420

USE BOOLEAN SOLVER TO DETERMINE
WHETHER OUTPUT IS CONSTANT
430

SYSTEM AND METHOD FOR CORRECTING GATE-LEVEL SIMULATION ACCURACY WHEN UNKNOWNS EXIST

RELATED APPLICATIONS

This application claims the benefit of U.S. Provisional Application Ser. No. 61/535,579, filed Sep. 16, 2011, entitled METHODS FOR IMPROVING GATE-LEVEL SIMULATION ACCURACY WHEN UNKNOWNS EXIST, the entire disclosure of which is herein incorporated by reference, and this application also claims the benefit of U.S. Provisional Application Ser. No. 61/593,892, filed Feb. 2, 2012, entitled METHODOLOGY FOR CORRECTING GATE-LEVEL SIMULATION WHEN UNKNOWNS EXIST, the entire disclosure of which is herein incorporated by reference.

FIELD OF THE INVENTION

The present invention relates generally to integrated circuit design and, more particularly, to correcting gate-level logic simulation when unknowns exist.

BACKGROUND OF THE INVENTION

Gate-level logic simulation is used extensively to verify the correctness of design netlists for integrated circuits. Typically, input stimuli are applied to the netlist, and the simulation results are compared with a golden model or pre-defined checkers. However, when unknown values (Xs) exist, gate-level simulation can no longer produce correct results due to a condition known as X-pessimism, in which simulation Xs are propagated even though the digital logic 0/1 value can be known.

Figure 1:
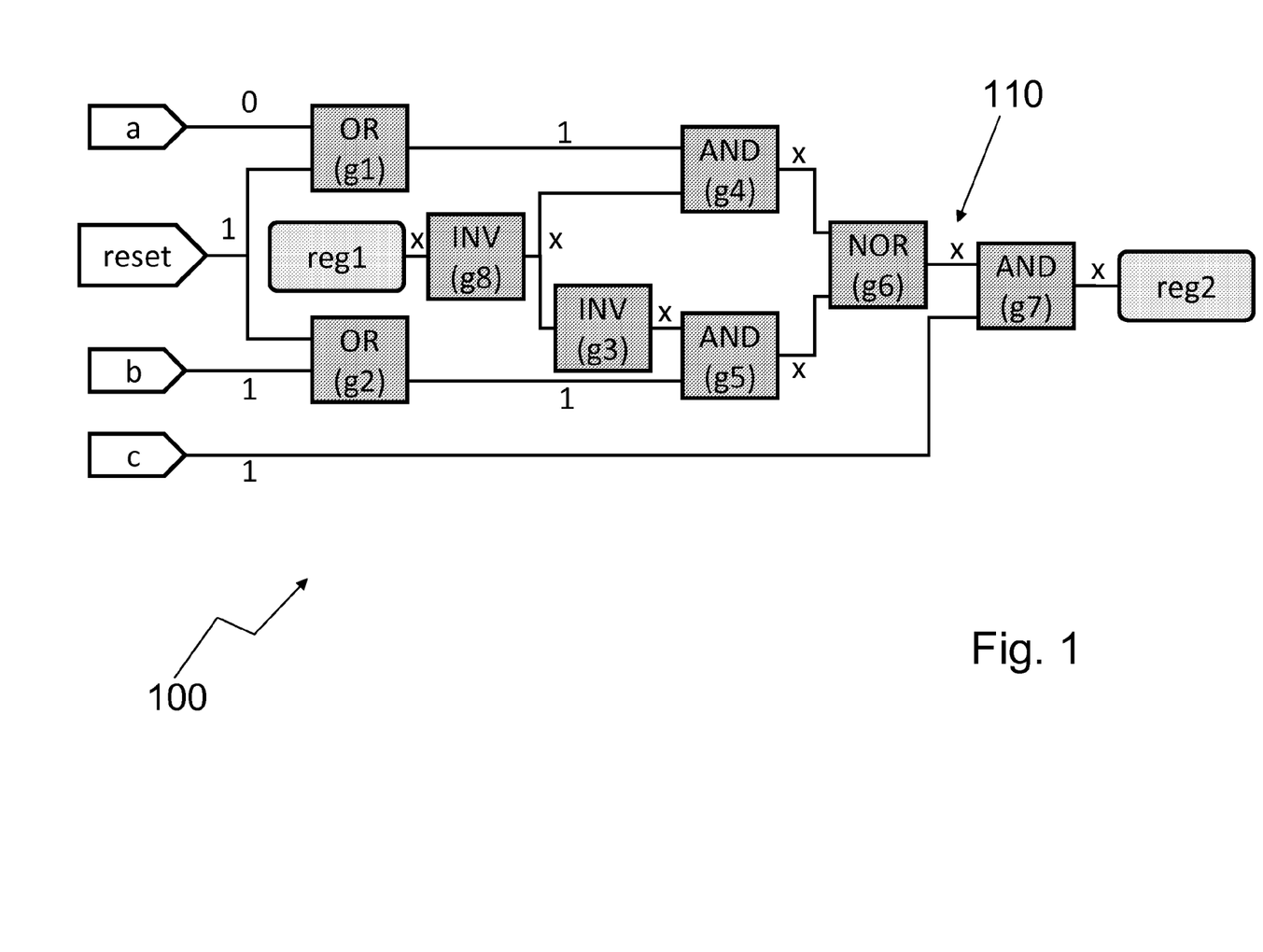
FIG. 1, already described, is a schematic diagram of an exemplary design netlist in which X-pessimism occurs, according to an illustrative embodiment.

Reference is now made to FIG. 1, showing a schematic diagram of an exemplary design netlist 100 in which X-pessimism occurs, according to an illustrative embodiment. As shown in FIG. 1, the output 110 of gate g6 should be 0 but logic simulation produces an X value instead. Such inaccuracy can, in turn, produce numerous false Xs during simulation, rendering gate-level simulation highly inaccurate, or even useless in some instances. This problem is becoming more severe due to physical optimizations and low-power requirements that allow Xs to exist in the design.

One prior art solution to the problem is to deposit random values at registers, such as the work by Hira et al., in U.S. Published Patent Application No. 2010/0017187, entitled RANDOM INITIALIZATION OF LATCHES IN AN INTEGRATED CIRCUIT DESIGN. The Hira approach eliminates X problems by converting Xs into non-X values. However, each deposited value only represents one of the two possible values that the register can have. This can disadvantageously cause bugs to escape verification.

Figure 2:
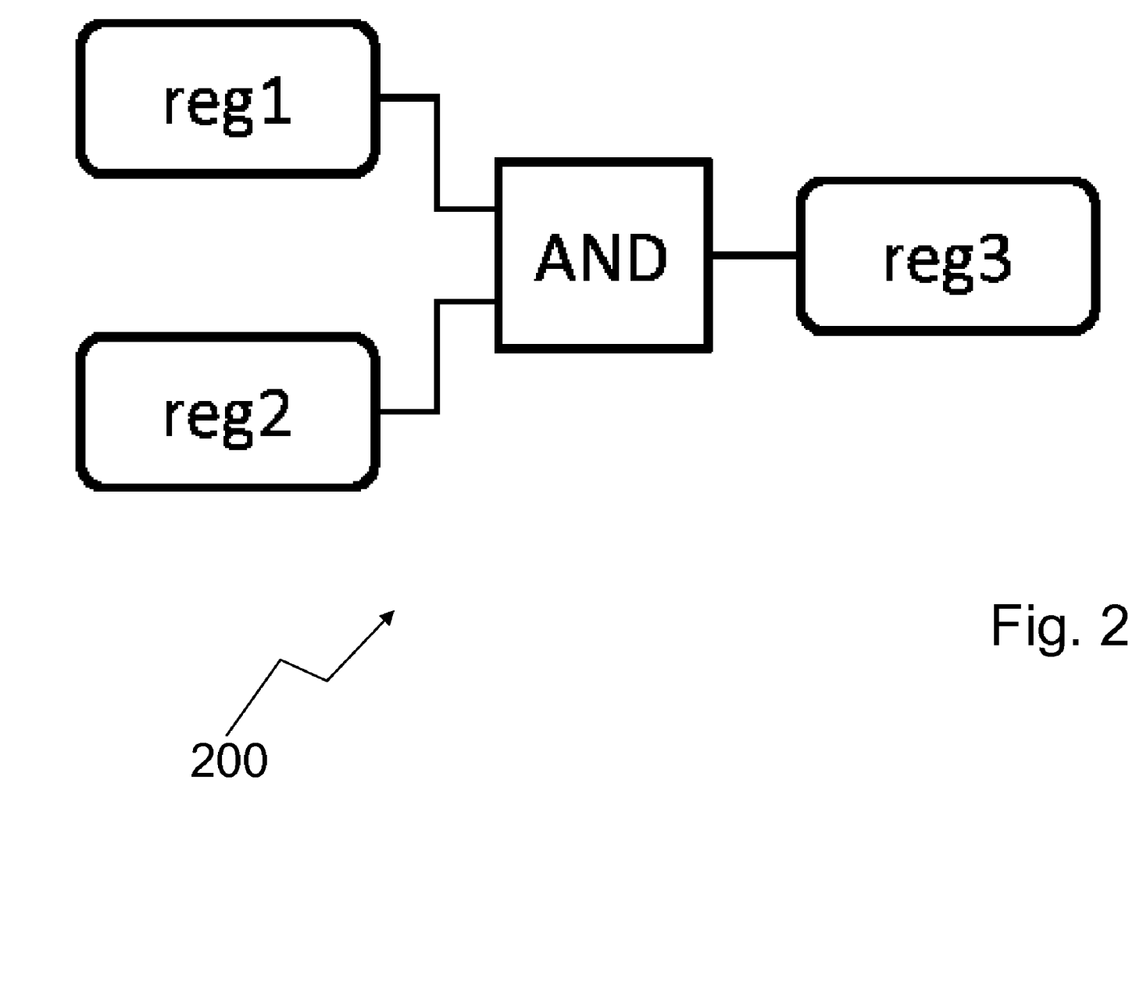
FIG. 2, already described, is a schematic diagram of an exemplary design netlist in which random initialization of registers can cause missed bugs, according to an illustrative embodiment.

Reference is now made, by way of example, to FIG. 2 showing a schematic diagram of an exemplary integrated circuit design netlist in which random initialization of registers can cause missed bugs. Assume that it is a bug in the circuit of FIG. 2 if reg3 latches at 1 at the first cycle. This bug may be missed according to the prior art Hira approach which deposits random values to reg1 and reg2 unless the deposited values are 1 for both registers.

To overcome the X-pessimism problems in gate-level simulation, it is desirable to locate false Xs that are produced during simulation. Reference is made, by way of example, to Chang et al., "Handling Nondeterminism in Logic Simulation So That Your Waveform Can Be Trusted Again", *IEEE D&T Early Access*, which proposes a formal technique and process that locates false Xs during simulation. However, this solution is not generic. More particularly, the proposed solution replaces the false Xs in registers with the correct non-X values when the formal analysis is applied during simulation. Accordingly, this solves the problem of false Xs produced during simulation at the time, but does not resolve any subsequent false Xs that may occur, even if the conditions that produced the false Xs are identical.

It is desirable to provide systems, methods and processes for correcting gate-level simulation when unknown values (Xs) exist.

SUMMARY OF THE INVENTION

In an illustrative embodiment, this invention overcomes disadvantages of the prior art by correcting gate-level logic simulation when unknown values (Xs) exist. Illustratively, false Xs are identified when simulating a given input trace, and auxiliary code is generated so that the false Xs can be eliminated in simulation results. The auxiliary code is used with logic simulation of the original netlist to eliminate the false Xs. In embodiments, the code can be Verilog, System-Verilog or other languages known in the art and/or developed in the future for setting up and performing gate-level simulation. In particular, the auxiliary code is adapted to be used with logic simulation so that false Xs in the simulation traces are eliminated.

According to an illustrative embodiment, a system, method and/or process to correct gate-level simulation commences by first, during each cycle of simulation, Xs in register data inputs are verified to determine if they are false. Then, for each false X, the fan-in cone of the register input is traced to find a portion of the cone, referred to herein as a "sub-circuit", whose inputs have real Xs and whose output has a false X. The fan-in cone of the register input refers to the signals which the input depends on. An auxiliary code is then generated as part of a testbench to eliminate false Xs. A testbench is a virtual environment used to verify the correctness of the integrated circuit design. Finally, according to the illustrative process, the original simulation is rerun with the auxiliary code, which will eliminate the false Xs, and allow the gate-level simulation to produce correct results.

The illustrative system, method and/or process proves whether an X is false under the current simulation values; traces the fan-in cone of a register input to find a small sub-circuit that can eliminate the false Xs; and generates auxiliary code to fix gate-level simulation based on the sub-circuit and the simulation values.

BRIEF DESCRIPTION OF THE DRAWINGS

The invention description below refers to the accompanying drawings, of which.

DETAILED DESCRIPTION

In an illustrative embodiment, gate-level simulation can be corrected when unknown values (Xs) exist. The illustrative simulation correction application first identifies false Xs when simulating a given input trace. It then analyzes the combinational fan-in cones of such false Xs to locate a small sub-circuit responsible for causing the false Xs. Finally, the simulation correction application generates auxiliary code to eliminate those false Xs.

I. Overall System

Figure 3:
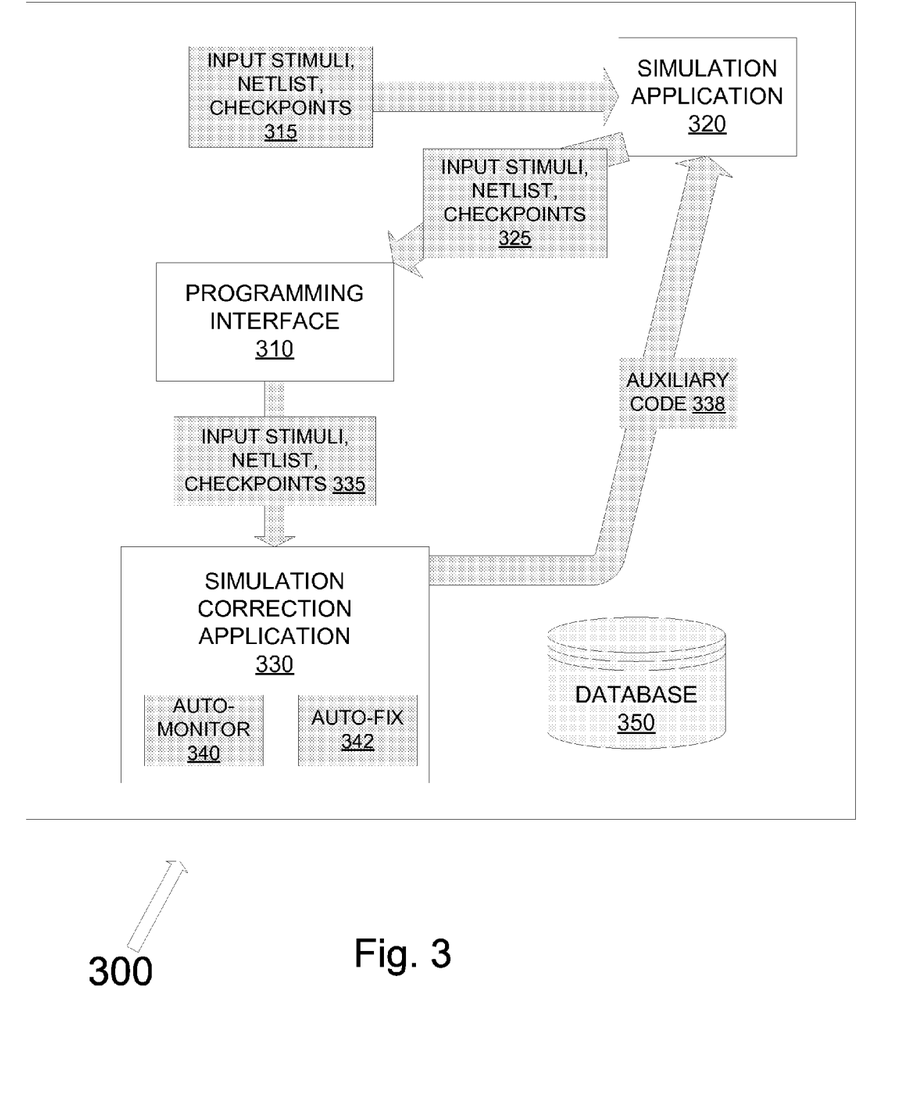
FIG. 3 is a block diagram of a simulation environment including programming interface, a simulation application and a correcting simulation application, according to an illustrative embodiment.

In a simulation environment 300, a programming interface provides inputs for gate-level simulation using a simulation application. The simulation application and/or other processes and procedures herein can be implemented using specialized electronic hardware (e.g. customized processing chips), or typically as software consisting of a non-transitory computer-readable medium of program instructions, or as a combination of hardware and software. In an embodiment, the application and/or other processes herein can be instantiated on a general purpose computer, such as a personal computer (PC) or workstation, or on another equivalent computing device. Such computing device can include a conventional user interface (e.g. a command-line interface and/or graphical user interface (GUI) with appropriate input devices (e.g. display, keyboard, mouse, touch screen, etc.).

The programming interface can be implemented separately as shown, or implemented natively within the simulation application. In accordance with an illustrative embodiment, a simulation correction application is employed to correct the gate-level simulation, as described in greater detail hereinbelow. The programming interface 310 is operatively connected to the simulation application 320 and the simulation correction application 330, as shown in FIG. 3. The inputs to the simulation correction application 330 are obtained from simulation application 320 through programming interface 310 and include a trace as input stimuli, a gate-level netlist and a set of time points, referred to as checkpoints, at which the Xs should be checked to determine whether they are false or not. The input stimuli, netlist and checkpoints are read by the simulation application 320. The simulation application 320 is in communication with the simulation correction application 330 through the programming interface 310. The simulation correction application 330 obtains the input stimuli, netlist and checkpoints via datastream 335 from the programming interface 310. The input stimuli, netlist and checkpoints are transmitted from the simulation application 320 to the programming interface 310 via datastream 325. The output from the simulation correction application 330 is auxiliary code 338 that, when stimulated by the simulation application 320 with the trace, the false Xs at the checkpoints are replaced with the correct values. If each cycle has a checkpoint, it essentially guarantees that no false Xs will be latched into registers based on the current simulation values. The auxiliary code is used by the simulation application 320 to correct values during runtime simulation ("on-the-fly"), or to correct future simulation values. The auxiliary code can be, illustratively, coded in Verilog, SystemVerilog, VHSIC Hardware Description Language (VHDL) or other appropriate (and/or equivalent) languages used for gate-level simulation. The simulation correction application 330 includes an auto-monitor feature 340 and auto-fix feature 342, described in greater detail hereinbelow with reference to FIG. 9. The various data is stored within a database 350 for access by the various programming interfaces and applications of the simulation environment 300 in accordance with conventional techniques known to those skilled in the art.

Generally, if a netlist is modeled using basic gate types such as AND, OR, XOR, INV, etc., then gate-level simulation characteristically can only produce X-pessimism problems during the simulation of the combinational logic and cannot produce X-optimism problems. This is due to the fact that for each gate, all inputs thereto are evaluated during simulation, and the output of the gate is determined pessimistically (i.e. it produces a known value only if the Xs on the inputs are guaranteed not to propagate to the output). As a result, the non-X values in gate-level simulation are constantly correct, while the Xs can be false. In accordance with the simulation correction application 300, this characteristic of design netlists is employed to reduce formal analysis, which achieves performance gain over pure formal methods. Given that combinational cells in cell libraries are typically composed of such basic gates, most designs possess this characteristic.

In summary, the overall simulation correction application 330 operates according to the following procedure steps, and is described in greater detail hereinbelow. First, at each checkpoint, the Xs in register data inputs are checked to determine if they are false. Second, for each false X, the fan-in cone of the register input is traced to find a portion of the cone, referred to herein as a "sub-circuit", whose inputs have real Xs and whose output is a false X. Third, auxiliary code is generated based on the sub-circuit to eliminate such false Xs. And finally, the original trace is resimulated with the auxiliary code and the code eliminates the false Xs. This overall process performed by the simulation correction application 330 allows gate-level simulation to produce correct results.

II. Identifying False Unknown Values (Xs)

Figure 4:
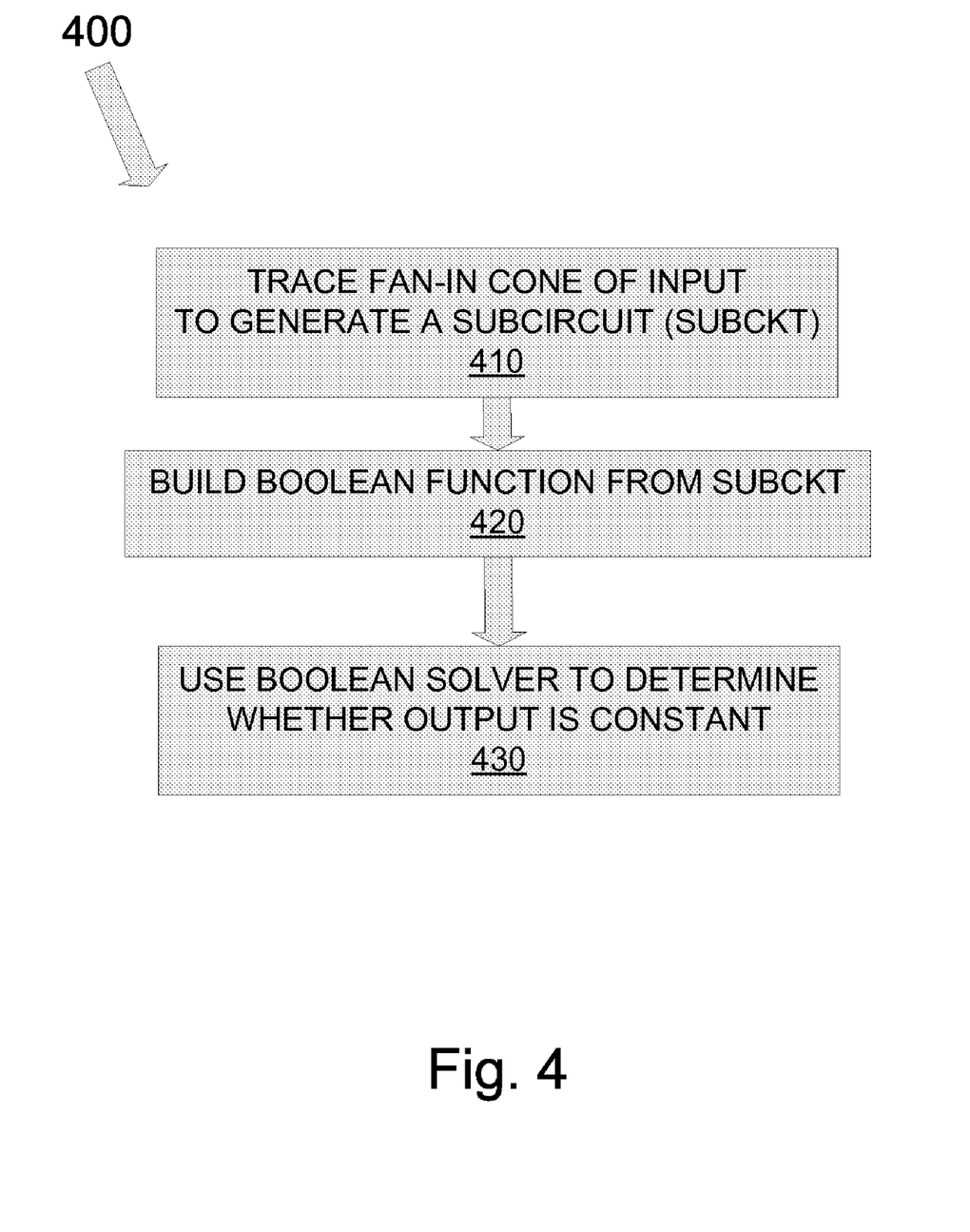
FIG. 4 is a flow diagram of a process for identifying whether an X is false, according to an illustrative embodiment.

The process for identifying whether an X is false is shown in FIG. 4. The input to the process is a register data input ("d") that has X in logic simulation. The process determines whether the X is false and returns the fan-in cone of the register data input as a sub-circuit ("subckt"). As shown in FIG. 4, the procedure commences at step 410 by tracing the fan-in cone of the input along the variables whose logic simulation values are Xs to generate the sub-circuit. All of the gates along the trace are added to the sub-circuit. When the variable is a primary input of the design or an output of a register, no further gates are added to the sub-circuit. Next, at step 420, a Boolean function is built from the sub-circuit. The output of the function is the register data input, and the inputs are the primary inputs of the sub-circuit. For each input to the sub-circuit, if the logic simulation value is not X, the non-X value is propagated through the input to simplify the Boolean function. If the value is X, the input remains an input of the Boolean function. At step 430, a Boolean solver is used to determine whether the output is constant to determine whether there is a false X. If the output is constant, return true, otherwise return false. The sub-circuit, subckt, is also returned in accordance with the procedure for identifying false Xs.

The illustrative program instruction code below in Table 1 is an example of a process for determining whether an X is false and returning the sub-circuit that is responsible for producing the X.

TABLE 1

```
function checkX(input d, output subckt);
1       pi_frontier ← d;
2       while (pi_frontier not empty)
3           var ← pi_frontier.pop( );
4           gate ← var.get_fanin_gate( );
5           subckt ← subckt ∪ gate;
6           foreach input ∈ gat e.get_inputs( )
7               if (input.value = x &&
                    input ∉ {design inputs, register outputs})
8                   pi_frontier ← pi_frontier ∪ input;
9       return proveX (subckt);
```

As shown, at line 1 of the illustrative code listing, the input d is inserted into pi_frontier, which is a set of inputs to the fan-in cone logic collected in subckt (the sub-circuit) thus far. The fan-in cone is then expanded by popping a variable, var, from pi_frontier (in line 3) and get the gate, gate, that fans out to the variable in line 4. The gate is then added to the sub-circuit, subckt, in line 5. In line 6, the inputs of gate are verified, or checked, and an input to pi_frontier is added if (1) the input has an X value in logic simulation, and (2) the input is not the primary input or a register output. The second condition stops fan-in extraction at register boundaries, rendering the analysis combinational. Line 9 calls the function proveX to prove whether the X in the sub-circuit's (subckt's) output, d, is real.

The code function proveX is illustratively implemented according to the following procedure steps. The function first builds a Boolean function from the sub-circuit subckt (e.g. step 420 of FIG. 4). For each input of the sub-circuit, subckt, if its corresponding variable has an X value in logic simulation, it becomes an input of the function; otherwise the non-X value is assigned to the input and propagates the constant into the logic function. A formal solver is then used (e.g. step 430 of FIG. 4) to determine whether the output can have different values. In accordance with the illustrative embodiment, random simulation values can first be used to calculate several values of the Boolean function. If the values can be different, the X is real, and proveX returns true. If all the values are identical, a SAT (satisfiability) instance is formed from the Boolean function and constrains the output of the function to the opposite value from simulation. A SAT solver is then used to solve the instance. If SAT found a solution, the X is real and proveX returns true. Otherwise, proveX returns false.

Given that the procedure is generally free of any X-optimism in gate-level simulation, all non-X values are correct, allowing them to be used directly in the function to verify for false Xs, without the risk of masking any real X problems. Therefore, only Xs need to become inputs to the Boolean function. The Boolean function is typically much smaller than the complete fan-in cone of the input d, which allows false Xs to be proven efficiently.

III. Minimizing X-Eliminating Sub-Circuit

In the process above for identifying false Xs, the sub-circuit returned is able to eliminate Xs and should not produce a false X on its output. However, due to X-pessimism, when proveX returns false, the returned sub-circuit produces a false X on its output. To repair logic simulation, the simulated values on the inputs of the sub-circuit can be monitored and the X on its output eliminated when the condition matches. Still, nonetheless, the sub-circuit can be unnecessarily large due to its inputs as either primary inputs or register outputs, but the logic that produces the false X can comprise only a small portion of the sub-circuit. Identification of this portion of the sub-circuit enables the generated fix to repair the logic simulation significantly more compact. Additionally, the generated fix can potentially eliminate multiple false Xs that have overlapping fan-in cones, thereby reducing the number of fixes that need to be generated. In accordance with a two-part illustrative process, these advantages are achieved, by a first process that reduces the sub-circuit from its output by tracing the X towards its inputs, and then by a second process that proceeds from the inputs towards the output.

The illustrative code listing below in Table 2 is an example of a process for tracing the fan-in of false Xs to reduce the X-elimination sub-circuit from the output. The input to the tracing function is the sub-circuit from the function for checking whether an X is false. The output of the tracing process is a new sub-circuit, called subckt$_n$, that is a subset of the originally sub-circuit and still produces false Xs.

TABLE 2

```
function ckt_minimize 1(input subckt, output subckt_n);
1       new_po ← subckt.get_output( );
2       subckt_n ← subckt;
3       do
4           gate ← new_po.get_fanin_gate( );
5           c_po ← new_po;
6           foreach input ∈ gat e.get_inputs( )
7               subckt_input ← fanin cone of input in subckt;
8               if (input.value = x &&
                    proveX (subckt_input) = false)
9                   new_po ← input;
10                  subckt_n ← subckt_input;
11          if (c_po = new_po)
12              break;
13      return;
```

The function shown above in Table 2 initiates using the original output of the sub-circuit from the X checking process, checkX above, and traces the Xs in its fan-in cone until a real X is reached. The last false X then becomes the new output of the sub-circuit, subckt$_n$, that also eliminates Xs. Note that during the tracing step, if there is more than one input that has a false X for a given gate, the illustrative procedure picks the first one (i.e. lines 6-8 of the code listing above). Accordingly, more than one iteration can be employed to eliminate all the false Xs, due to the X-eliminating sub-circuit now eliminating the X only at the chosen input. Accordingly, after a fix is found, the X in the fixed variable is replaced with its non-X value and logic simulation is performed on the original fan-in cone of the input d. Then d is verified to determine if it is X. If d is X, then the same repair analysis is performed again, and desirably repeats until d is no longer X. Thus, the false X at d is successfully and advantageously repaired by the fixes generated for its fan-in cone.

Figure 5:
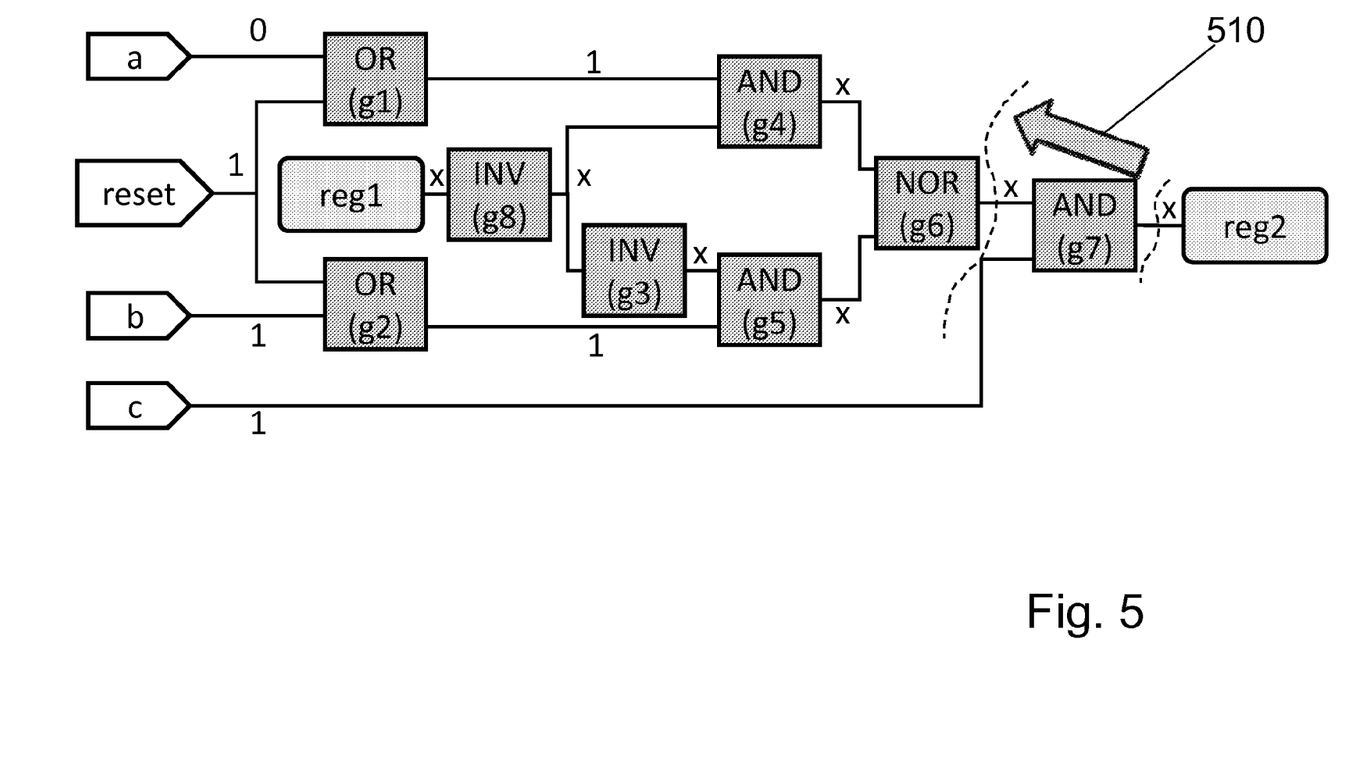
FIG. 5 is a schematic diagram of an exemplary design netlist in which X-pessimism occurs, showing a first step in the repair process, according to an illustrative embodiment.

FIG. 5 shows an example of the first step in the process of tracing the fan-in cone of the false X (arrow 510) to find the first appearance of false Xs. This reduces the X-eliminating sub-circuit from its output.

Figure 6:
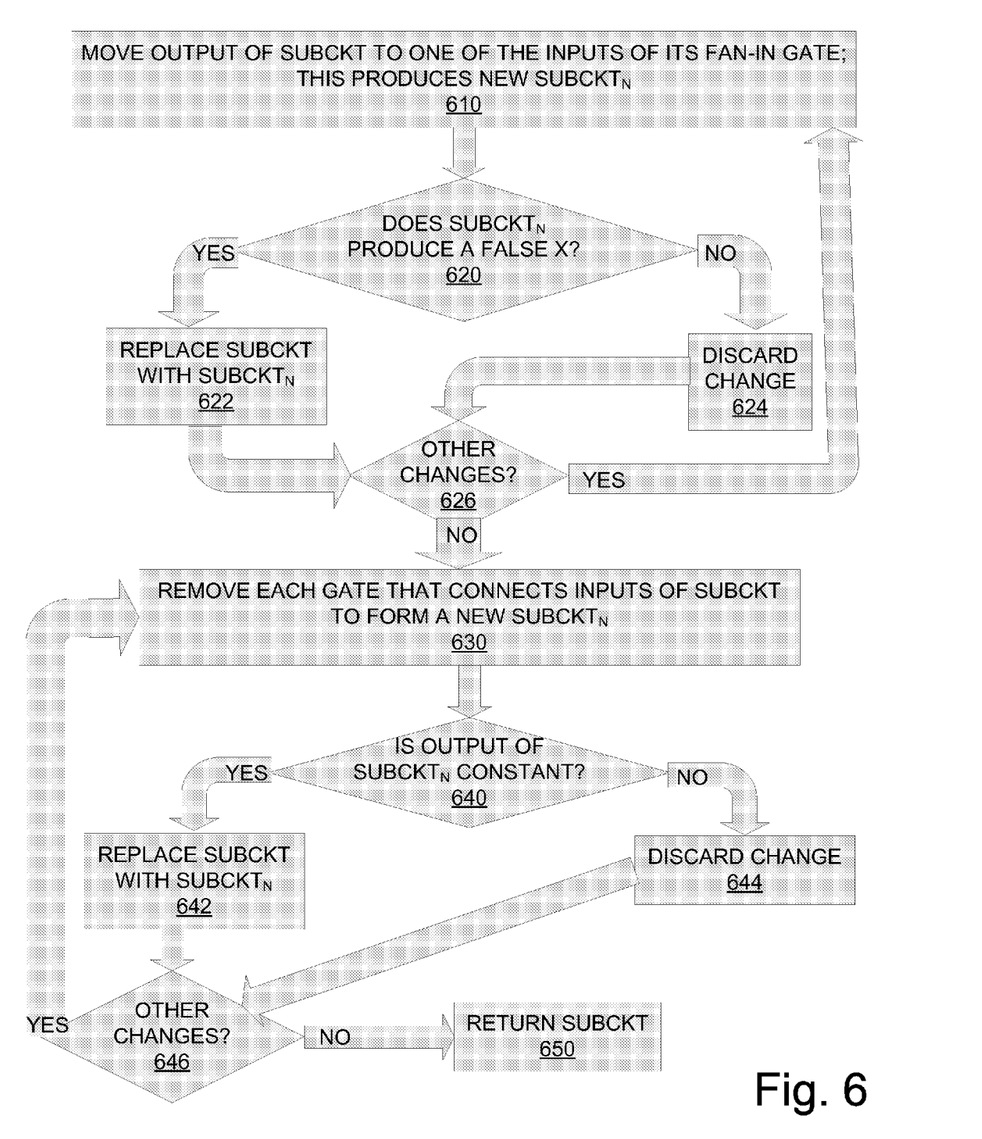
FIG. 6 is a flow diagram of an overall process for minimizing the X-elimination sub-circuit by moving its outputs toward its inputs and by moving its inputs toward its outputs, according to an illustrative embodiment.
Figure 7:
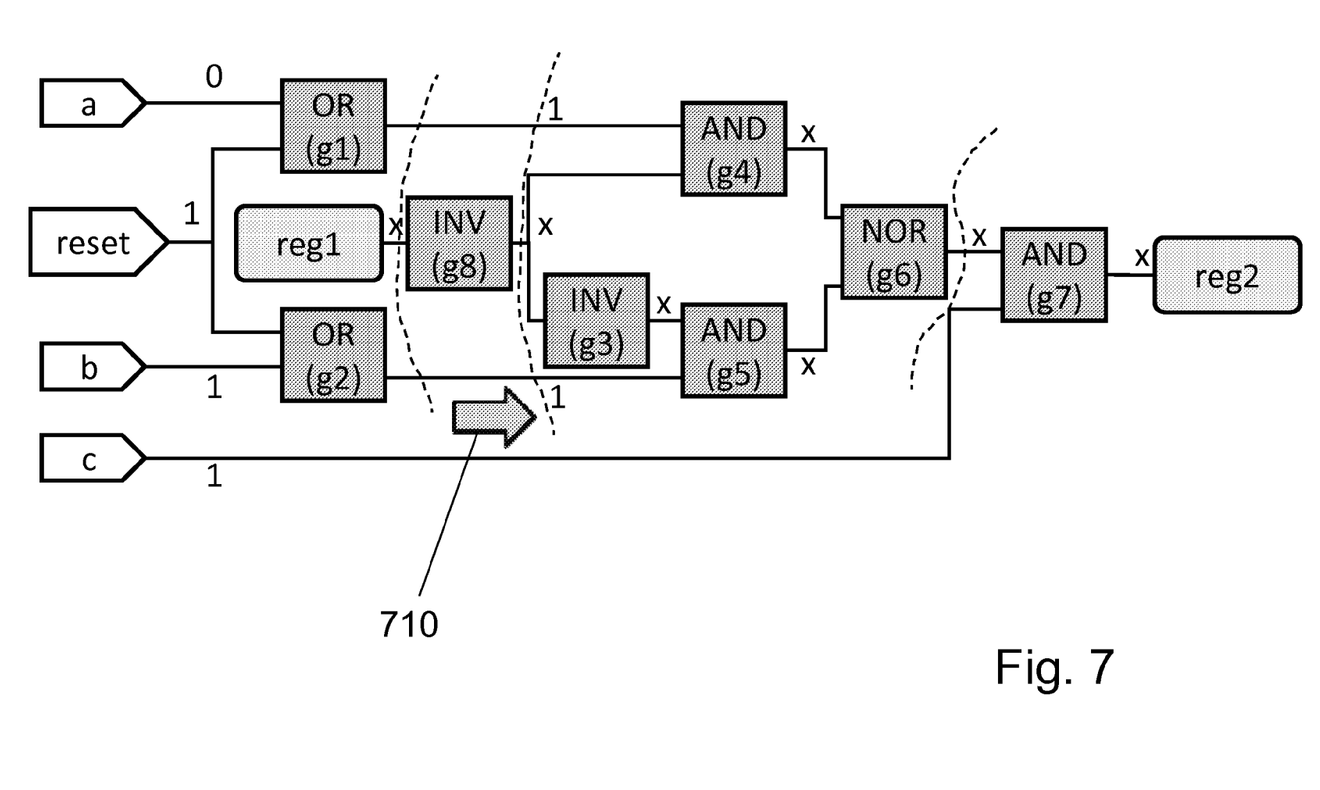
FIG. 7 is a schematic diagram of an exemplary design netlist in which X-pessimism occurs, showing a second step in the repair process, according to the illustrative embodiment.

To further minimize the sub-circuit, a second process for moving the input frontier of the sub-circuit toward the output is employed, as shown by way of example in FIGS. 6 and 7. More particularly, the process for moving the input frontier transitions the input frontier of the sub-circuit towards the output. The input to the process is a sub-circuit, which is the sub-circuit (subckt$_n$) returned by the first tracing process described above, for tracing the fan-in of false Xs to reduce the X-elimination sub-circuit from the output. The output of the second process for moving the input is a new sub-circuit saved as the variable subckt$_n$.

The code below in Table 3 is an example of a process for minimizing an X-elimination sub-circuit by moving its primary inputs towards its output. The input to the process is a sub-circuit, which is the sub-circuit (subckt$_n$) returned by the first tracing process described above, for tracing the fan-in of false Xs to reduce the X-elimination sub-circuit from the output. The output of the second process for moving the input is a new sub-circuit saved as subckt$_n$.

TABLE 3

```
   function ckt_minimize2(input subckt, output subckt_n);
1      subckt_n ← subckt;
2      do
3         changed= false;
4         foreach gate connected to subckt_n.get_inputs( );
5            subckt_n ← subckt_n \ gate;
6            if (proveX (subckt_n) = false)
7               changed = true;
8               break;
9            else
10              subckt_n ← subckt_n ∪ gate;
11     while (changed);
12     return;
```

In line 1 of the exemplary program code function/process, the sub-circuit, subckt, is copied to the new sub-circuit, subckt$_n$. In lines 4-10 of the illustrative function, each gate that connects to the primary inputs of the new sub-circuit, subckt$_n$, is removed to determine whether the output is still a false X (e.g. step 640 of FIG. 6). If the X is still false, the change is kept (lines 6-8), see step 642. Otherwise, the gate is added back (line 10), see step 644. This process repeats until no further gates can be removed (the do-while loop of lines 2-11 above). The inputs of the sub-circuit have now been moved as close to its output as possible.

FIG. 6 shows a flow chart of an overall procedure for minimizing an X-elimination sub-circuit by moving its primary inputs towards its output. The procedure commences at step 610 by moving the output of the sub-circuit to one of the inputs of its fan-in gate that has X in logic simulation. This produces a new sub-circuit, subckt$_n$. Then, at step 620, the false-X identification process described hereinabove is employed to determine whether the new sub-circuit, subckt$_n$, produces a false X. If it does not produce a false X, the change is discarded at step 624. If it does produce a false X, the sub-circuit is replaced with the new sub-circuit, subckt$_n$, at step 622. If further changes need to be made at step 626, the procedure then returns to step 610 to repeat these steps until no further changes need to be made at step 626. At this point, the primary output of the sub-circuit, subckt, called cpo, is a variable whose X is false that is farthest from the output of the original cub-circuit, subckt. The following steps 630-650 then reduce sub-circuit, subckt, from its inputs.

At step 630, each gate that connects to the primary inputs of the sub-circuit subckt is removed, one at a time, to form a new sub-circuit called subckt$_n$. At step 640, the procedure verifies the sub-circuit output, cpo, to determine whether it is still constant. If it is no longer constant, the change is discarded at step 644. Otherwise, at step 642, the sub-circuit, subckt, is replaced with the new sub-circuit, subckt$_n$. And steps 630 and 640 are repeated until no further changes can be made at step 646. At this point, the sub-circuit, subckt, is a subset of the original sub-circuit whose inputs are real Xs and whose output is a false X. Since removing any single gate will produce a real X again, this sub-circuit is a locally minimal one that can eliminate the X.

FIG. 7 shows an illustrative embodiment of the second portion of the overall process, of moving the primary inputs of the sub-circuit towards its output (arrow 710) to reduce the fan-in cone for a compact fix.

IV. Generating Simulation-Repair Code

The sub-circuit (subckt$_n$) produced in accordance with the illustrative processes and functions described herein for minimizing X-eliminating sub-circuits can be employed to generate auxiliary code to repair gate-level logic simulation. An illustrative procedure/process to generate the simulation repair code is shown in the flow chart of FIG. 8. At step 810, the procedure traverses the inputs of the sub-circuit, subckt$_n$, to generate the condition for the false X to occur based on their logic simulation values, to produce a generated code. For example, if variable var1 has a value of 1 and variable var2 has a value of X in logic simulation, the condition is (for example) "var1===1'b1 && var2===1'bx" when expressed in the Verilog language.

Figure 8:
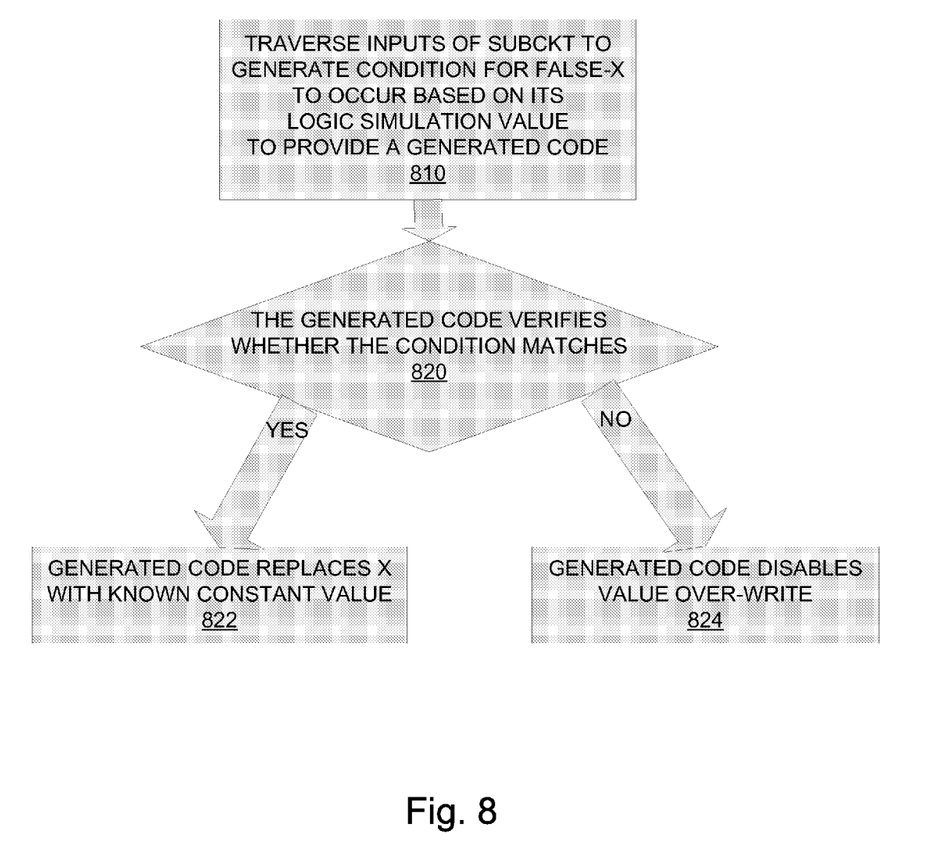
FIG. 8 is a flow diagram of a process for generating auxiliary repair code to be used in gate-level simulation, according to the illustrative embodiment.

The generated auxiliary code works as follows. During simulation, at step 820, the generated code determines whether the condition matches. If the condition does match, X is replaced with a known constant value at step 822 by the generated code. The constant value can be derived by assigning random non-X values to the inputs of the sub-circuit, subckt, and verifying its output. If the condition does not match, the generated code disables the value over-write at step 824. For example, in the Verilog and System-Verilog hardware description languages, commands "force", "release", and "deposit" can be employed to achieve this operation.

In accordance with the illustrative embodiment, the code is generated to replace the X on the output of the sub-circuit with the non-X value when the condition matches. The non-X value can be derived by assigning random values to the inputs of the sub-circuit, subckt$_n$, and then verify its output. Alternatively, the constant value proven by proveX can be retained and employed here.

An example of the code generated for correcting the exemplary X-pessimism of FIG. 1 is shown in Table 4 below. In the example, the output port of a combinational gate is named "o".

TABLE 4

```
always @(g1.o or g2.o or g8.o)
if (g8.o === 1'bx && g1.o ===1'b1 && g2.o === 1'b1)
   force g6.o ===1'b0;
else
   release g6.o;
```

The generated code corrects all false Xs that match the condition, even if the Xs are not within the analyzed period of the trace or are in a different trace. This is because the constructed sub-circuits follow the semantics of X and non-X values in logic simulation. In logic simulation, X can be either 0 or 1, which is consistent with our construction that the variable is an input to the sub-circuit. For non-X values, they are propagated into the sub-circuit by stopping at non-X boundaries when constructing the Boolean function for X-proving, and this is also consistent with the semantics of logic simulation. Therefore, the sub-circuit faithfully captures the behavior of the netlist, and this allows the output of the sub-circuit to be replaced with the correct value during gate-level simulation without creating or masking any problem. The simulation is fixed by automatically generating (for example) Verilog behavioral code to correct gate-level logic simulation.

V. Correcting Gate-Level Simulation when Xs Exist

Figure 9:
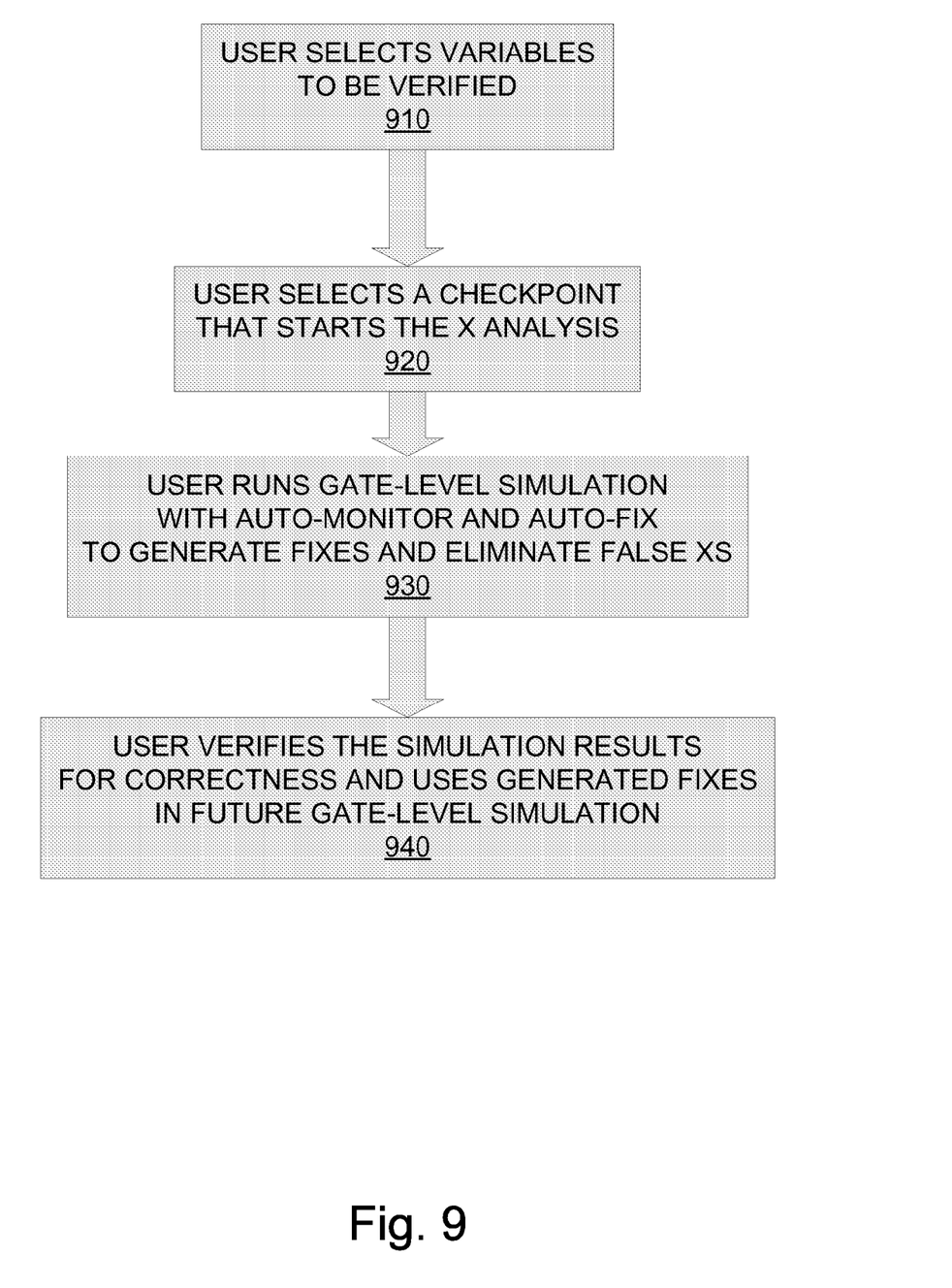
FIG. 9 is a flow diagram of a process for correcting gate-level simulation when Xs exist, according to the illustrative embodiment.

The overall procedure for correcting gate-level simulation when unknown values (Xs) exist is shown in FIG. 9, according to an illustrative embodiment. The procedure commences at step 910 when a user selects variables to verify, or check. The variables to be verified are typically data inputs to registers and latches. At step 920, the user chooses a checkpoint (a time point where X should be verified) that starts the X analysis. The checkpoint is typically within the reset sequence because this is when the most number of false Xs are typically generated. The reset signal provides non-X values while many registers still have X values. However, depending upon the design and trace being analyzed, the checkpoint can be placed anywhere desired, including the beginning of simulation, and is highly variable within the purview of ordinary skill. The user then runs gate-level simulation with auto-monitor and auto-fix at step 930. The gate-level simulation with auto-monitor and auto-fix generates fixes and eliminates the previously identified false Xs during runtime simulation. Finally, at step 940, the user verifies the simulation results for correctness, and can employ the generated fixes in future gate-level simulation.

The auto-monitor feature of step 930 (also auto-monitor 340 of simulation correction application 330 of FIG. 3) operates by monitoring the gate-level simulation values on the fan-in cone of the selected variables and checks for false Xs when the values change. More particularly, a variable is verified again only if the variable has an X value and at least one (and potentially more) of the variables in its fan-in cone have value changes. Illustratively, auto-monitor can be implemented with any programming interface provided by the simulator that can monitor simulation values, such as Programming Language Interface (PLI) or Verilog Procedural Interface (VPI). It can be also be implemented natively within the simulator.

The auto-fix feature of step 930 (also auto-fix 342 of simulation correction application 330 of FIG. 3) operates by applying the fixes generated by the correct simulation values determined in accordance with the illustrative procedures herein. Auto-fix monitors simulation values of the variables in the conditions of the fixes and then deposits the non-X values to the variable that has the false X when the values match the conditions. When the values no longer match the conditions, the force is released. To monitor simulation values and deposit values, Programming Language Interface (PLI), Verilog Procedural Interface (VPI), or any interface that can control the simulator can be employed. It can also be implemented natively within the simulator itself.

In accordance with the various procedures, systems and illustrative embodiments herein, a user can achieve correct gate-level simulation results in one single run-time implementation of simulation, and then use the generated fixes for future simulations. This overcomes the disadvantage of requiring multiple runs or implementations of the X analysis to achieve gate-level simulation. Moreover, the advantages and efficiency afforded by the procedures and systems shown and described herein should be apparent to those having ordinary skill in the art. The analysis is simplified by analyzing a smaller logic cone, and false Xs can thus be proved more efficiently.

The foregoing has been a detailed description of illustrative embodiments of the invention. Various modifications and additions can be made without departing from the spirit and scope of this invention. Features of each of the various embodiments described above can be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, while one X-pessimism example is shown for illustrative purpose, any design netlist can be employed in accordance with the teachings herein. Additionally, while particular exemplary code is shown and described for illustrative purposes, the auxiliary code generated in accordance with embodiments herein is highly variable within ordinary skill to achieve correction and accuracy improvement described hereinabove for gate-level simulation. Moreover, while particular arrangements of applications, computers, simulators, and other simulation environment elements are shown, the arrangements are highly variable and can be all disposed within a single server or computing device, or the applications can be spread over a variety of servers as appropriate and within ordinary skill. Also, where a "means" is referenced it should be taken to include a particular functional component/process/processor described herein, or various combinations of (all or part of) a plurality of components/processes/processors described herein. Accordingly, this description is meant to be taken only by way of example, and not to otherwise limit the scope of this invention.

What is claimed is:

1. A method for correcting gate-level simulation comprising the steps of:
    identifying, by using a computer, unknown values (Xs) that are false when simulating a given trace of a design netlist;
    determining a sub-circuit of the design netlist for each false X having inputs of real Xs and an output of a false X; and
    generating code to correct each false X in simulation based on the sub-circuit to eliminate false Xs in simulation of the design netlist;
    wherein the step of identifying Xs that are false further comprises the steps of:
    tracing a fan-in cone of input of storage devices along gates that have X values to build the sub-circuit;
    building a Boolean function from the sub-circuit; and
    using a Boolean solver to determine whether the output of the sub-circuit is constant; and
    wherein the step of generating code to correct each false X in simulation comprises:
    traversing the inputs of the sub-circuit to generate code that checks for a condition for false X to occur based on its logic simulation value; and
    generating code to replace the X on the output of the sub-circuit with a non-X value when the condition matches and to disable value overwrite when the condition does not match.

2. The method of claim 1 further comprising the step of:
    resimulating the design netlist with the code to eliminate false Xs.

3. The method of claim 1 further comprising the step of:
    minimizing the sub-circuit by:
    tracing a fan-in cone of the sub-circuit to reduce the sub-circuit from the output; and
    moving the input of the sub-circuit towards the output.

4. The method of claim 1 wherein the code is in Verilog, SystemVerilog, VHSIC Hardware Description Language (VHDL), or languages that can control logic simulation such as Tcl, Perl, C, SystemC or C++.

5. The method of claim 1 further comprising the steps of:
identifying variables to be verified;
identifying a checkpoint that starts analysis for Xs;
running gate-level simulation with auto-monitor and auto-fix to generate fixes and eliminate false Xs; and
verifying simulation results for correctness and using generated fixes in future gate-level simulation.

6. The method of claim 5 wherein auto-monitor operates by performing the steps of:
monitoring the gate-level simulation values on a fan-in cone of the variables; and
verifying whether a false X exists for a variable when the gate-level simulation values in its fan-in cone change.

7. The method of claim 5 wherein auto-fix operates by performing the steps of:
applying the generated fixes;
monitoring simulation values of the variables in the generated fixes and, when the variables match a condition that activates a fix, depositing non-X values to the variable that has the false X, and, when the variable does not match the condition, the deposited value of the variable is released.

8. A system for correcting gate-level simulation comprising:
means for processing;
means for identifying unknown values (Xs) that are false when simulating a given trace of a design netlist;
means for determining a sub-circuit of the design netlist for each false Xs having inputs of real Xs and an output of a false X; and
means for generating code to correct each false X in simulation based on the sub-circuit to eliminate false Xs in simulation of the design netlist;
wherein the means for identifying Xs that are false further comprises:
means for tracing a fan-in cone of input of storage devices along gates that have X values to build the sub-circuit;
means for building a Boolean function from the sub-circuit; and
means for using a Boolean solver to determine whether the output of the sub-circuit is constant; and
wherein the means for generating code to correct each false X in simulation comprises:
means for traversing the inputs of the sub-circuit to generate code that verifies a condition for false X to occur based on its logic simulation value; and
means for generating code to replace X on the output of the sub-circuit with a non-X value when the condition matches and to disable value overwrite when the condition does not match.

9. The system of claim 8 further comprising means for resimulating the design netlist with the code to eliminate each false X.

10. The system of claim 8 further comprising means for minimizing the sub-circuit, including means for tracing a fan-in cone of the sub-circuit to reduce the sub-circuit from the output and means for moving the input of the sub-circuit towards the output.

11. The system of claim 8 wherein the code is in Verilog, SystemVerilog or VHSIC Hardware Description Language (VHDL) or languages that can control logic simulation such as Tcl, Perl, C, SystemC or C++.

* * * * *